United States Patent
Corsi

[11] Patent Number: 5,563,757
[45] Date of Patent: Oct. 8, 1996

[54] LOW LEAKAGE ESD NETWORK FOR PROTECTING SEMICONDUCTOR DEVICES AND METHOD OF CONSTRUCTION

[75] Inventor: Marco Corsi, Dallas, Tex.

[73] Assignee: Texas Instruments Incorporated, Dallas, Tex.

[21] Appl. No.: 395,938

[22] Filed: Feb. 27, 1995

[51] Int. Cl.$^6$ ........................................... H02H 9/00
[52] U.S. Cl. .................. 361/56; 361/91; 361/111; 361/118
[58] Field of Search ................ 361/56, 91, 118, 361/127, 42, 115, 100, 111; 340/347

[56] References Cited

U.S. PATENT DOCUMENTS

| | | | |
|---|---|---|---|
| 4,158,863 | 6/1979 | Naylor | 361/56 |
| 4,694,277 | 9/1987 | Takahashi | 340/347 |
| 5,416,030 | 5/1995 | Elkind et al. | 437/5 |

Primary Examiner—Jeffrey A. Gaffin
Assistant Examiner—Stephen Jackson
Attorney, Agent, or Firm—Alan K. Stewart; Richard L. Donaldson; William E. Hiller

[57] ABSTRACT

A low leakage ESD network (24) is provided for protecting a semiconductor device (22). The ESD network (24) comprises an ESD circuit (28) and a bias circuit (30). The ESD circuit (28) is connected to an input of the semiconductor device (22). The ESD circuit (28) is operable to protect the input of the semiconductor device (22) against electro-static discharge. The bias circuit (30) is connected to the input of the semiconductor device (22) and to the ESD circuit (28). The bias circuit (30) is operable to actively bias the ESD circuit (28) such that a voltage difference across each current leakage path in the ESD circuit (28) is held substantially equal to zero volts during normal operation of the semiconductor device (22).

14 Claims, 1 Drawing Sheet

LOW LEAKAGE ESD NETWORK FOR PROTECTING SEMICONDUCTOR DEVICES AND METHOD OF CONSTRUCTION

TECHNICAL FIELD OF THE INVENTION

This invention relates in general to the field of electronic devices, and more particularly to a low leakage ESD network for protecting semiconductor devices and a method of construction.

BACKGROUND OF THE INVENTION

Integrated circuits having numerous semiconductor devices commonly are formed on semiconductor chips that are then mounted in integrated circuit packages having multiple pins. An electro-static discharge to one or more of the pins of an integrated circuit package can force a pulse of current into a semiconductor device in the integrated circuit. The absorption of this energy can damage or destroy the semiconductor device particularly a sensitive device such as a MOS device which has thin gate oxides.

Electro-static discharge (ESD) circuits are often formed with and connected to semiconductor devices in order to protect the devices. An ESD circuit may be connected to vulnerable pins of a semiconductor device and would operate to absorb energy from an electro-static discharge in order to avoid damage to or destruction of the semiconductor device.

A problem that may occur with ESD circuits is damage to the ESD circuit itself after absorption of several electro-static discharges. As a result of electro-static discharge that may occur, ESD circuits may leak current because of damage internal to the ESD circuit. For example, p-n junctions in the ESD circuit may leak significant amounts of current after absorbing current pulses from numerous electro-static discharges.

SUMMARY OF THE INVENTION

Therefore a need has arisen for an ESD circuit that protects a semiconductor device without suffering from significant current leakage.

In accordance with the present invention, a low leakage ESD network for protecting semiconductor devices and a method of construction are provided that substantially eliminate or reduce disadvantages and problems associated with prior ESD circuits.

According to one embodiment of the present invention, a low leakage ESD network for protecting a semiconductor device is provided that comprises an ESD circuit and a bias circuit. The ESD circuit is connected to an input of a semiconductor device. The ESD circuit is operable to protect the input of the semiconductor device against electro-static discharge. The bias circuit is connected to the input of the semiconductor device and to the ESD circuit. The bias circuit is operable to actively bias the ESD circuit such that voltage differences across each current leakage path in the ESD circuit are held substantially equal to zero volts during normal operation of the semiconductor device.

According to another embodiment of the present invention, a method of constructing a low leakage ESD network for protecting a semiconductor device is provided. An ESD circuit is formed such that the ESD circuit is coupled to and protects an input of a semiconductor device against electro-static discharge. A bias circuit is formed that is coupled to the input of the semiconductor device such that the bias circuit provides a bias voltage output responsive to a voltage level of the input of the semiconductor device. Finally, the bias voltage output of the bias circuit is connected to the ESD circuit such that the bias circuit actively biases the ESD circuit to hold voltage differences across each current leakage path in the ESD circuit substantially equal to zero volts during normal operation of the semiconductor device.

A technical advantage of the present invention is the provision of a low leakage ESD network that provides low current leakage during normal operation of the semiconductor device.

A further technical advantage of the present invention is the provision of a guard ring bias voltage by the ESD network that can be used to drive a guard ring protecting pins of the integrated circuit package from surface leakage on a printed circuit board.

BRIEF DESCRIPTION OF THE DRAWINGS

A more complete understanding of the present invention and advantages thereof may be acquired by referring to the following description taken in conjunction with the accompanying drawings in which like reference numbers indicate like features and wherein.

DETAILED DESCRIPTION OF THE INVENTION

Figure 1:
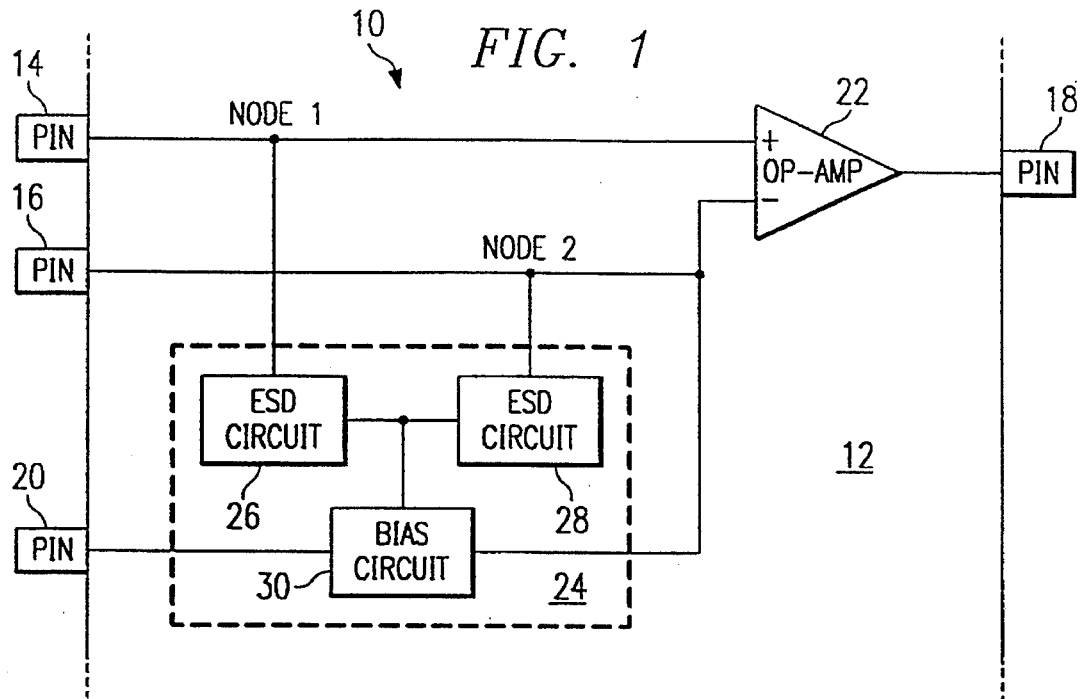
FIG. 1 is a circuit diagram of an ESD network, constructed according to the teachings of the present invention, connected to protect a MOS input operational amplifier.

FIG. 1 is a circuit diagram of an ESD network, constructed according to the teachings of the present invention, connected to protect a MOS input operational amplifier. An integrated circuit, indicated generally at 10, is formed on a semiconductor chip (not shown) mounted in an integrated circuit package 12. Package 12 comprises a plurality of pins including a first pin 14, a second pin 16, a third pin 18, and a fourth pin 20. First pin 14 is connected to a first node NODE 1, and second pin 16 is connected to a second node NODE 2. Integrated circuit 10 includes a MOS input operational amplifier 22 and an ESD network 24. Operational amplifier 22 includes a non-inverting and an inverting input, as shown. The non-inverting input is connected to NODE 1, and the inverting input is connected to NODE 2. Operational amplifier 22 also has an output connected to third pin 18.

ESD network 24 includes a first ESD circuit 26, a second ESD circuit 28, and a bias circuit 30. First ESD circuit 26 is connected to NODE 1. Second ESD circuit 28 is connected to NODE 2. Bias circuit 30 is connected to NODE 2 and is connected to first ESD circuit 26 and to second ESD circuit 28. Bias circuit 30 is also connected to fourth pin 20.

In operation, operational amplifier 22 performs standard functions of a MOS input operational amplifier. ESD network 24 operates to protect both inputs of operational amplifier 22 against electro-static discharge to first pin 14 or to second pin 16. In the event of an electro-static discharge to first pin 14, first ESD circuit 26 operates to absorb and dissipate the energy associated with the electro-static discharge. Similarly, second ESD circuit 28 operates to absorb and dissipate the energy associated with an electro-static discharge to second pin 16. In this manner, operational amplifier 22 is protected against electro-static discharge.

Bias circuit 30 operates to actively bias first ESD circuit 26 and second ESD circuit 28 such that voltage differences across each current leakage path in first ESD circuit 26 and second ESD circuit 28 are held substantially equal to zero volts during normal operation of operational amplifier 22. The bias voltage provided by bias circuit 30 of FIG. 1 is responsive to a voltage level of NODE 2. Due to the operation of operational amplifier 22, the voltage level of the non-inverting input and the inverting input are forced to the same value except for a nominal input offset voltage. This nominal input offset voltage may be approximately one millivolt and is orders of magnitude less than that of typical power supplies for such integrated circuits.

During normal operation, of operational amplifier 22, when there is not electro-static discharge, first ESD circuit 26 and second ESD circuit 28 are passive. However, bias circuit 30 actively biases first ESD circuit 26 and second ESD circuit 28 such that no leakage current flows out of or into first pin 14 or second pin 16. Thus, ESD network 24 provides low leakage ESD protection for operational amplifier 22. In the embodiment of FIG. 1, bias circuit 30 receives the voltage level of NODE 2. Bias circuit 30 then provides the bias voltage responsive to the voltage level of NODE 2. Receiving the voltage level of NODE 1 and the non-inverting input would provide substantially the same voltage level. In addition, the benefits of ESD network 24 are applicable to other types of semiconductor devices. AMOS input operational amplifier is shown only for purposes of describing the illustrated embodiment.

Bias circuit 30 also provides a guard ring bias voltage output which is connected to fourth pin 20. This guard ring bias voltage biases fourth pin 20 such that a voltage difference between fourth pin 20 and second pin 16 is held substantially equal to zero volts during normal operation of operational amplifier 22. Thus, first pin 14 and second pin 16 can be protected from surface leakage on a printed circuit board by biasing a guard ring with the voltage level available at fourth pin 20.

Figure 2:
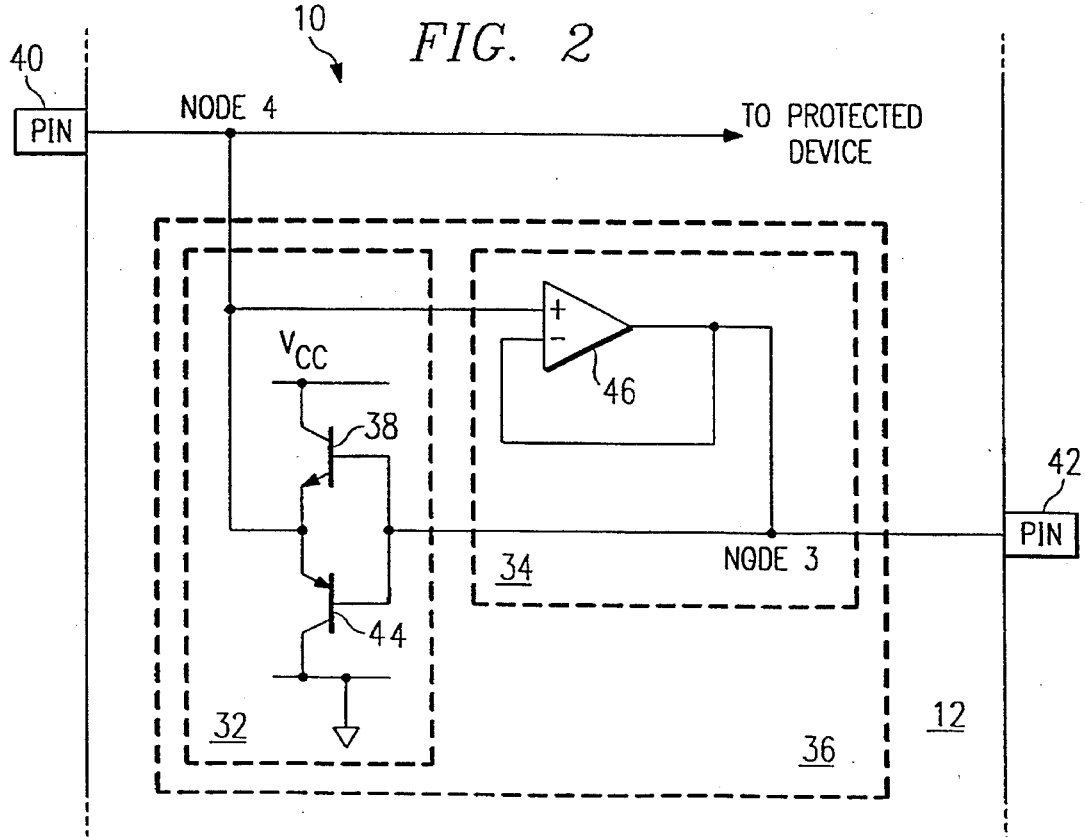
FIG. 2 is a circuit diagram of one embodiment of a bias circuit and an ESD circuit in an ESD network constructed according to the teachings of the present invention.

FIG. 2 is a circuit diagram of one embodiment of an ESD circuit 32 and a bias circuit 34 in an ESD network 36 constructed according to the teachings of the present invention. ESD network 36 is part of integrated circuit 10 in integrated circuit package 12.

ESD circuit 32 includes an NPN transistor 38 having a collector, a base, and an emitter. The collector of NPN transistor 38 is connected to a power supply $V_{cc}$. The base of NPN transistor 38 is connected to NODE 3, and the emitter of NPN transistor 38 is connected to a NODE 4. A first pin 40 is connected to NODE 4, and a second pin 42 is connected to NODE 3. NODE 4 is also connected to the protected device. NODE 4 may be connected to an input of the protected device including an input, input/output, or other node of the semiconductor device needing protection from electro-static discharge. ESD circuit 32 further includes a PNP transistor 44. PNP transistor 44 includes an emitter, a base, and a collector. The emitter of PNP transistor 44 is connected to NODE 4, the base of PNP transistor 44 is connected to NODE 3, and the collector of PNP transistor 44 is connected to ground potential.

Bias circuit 34 includes an operational amplifier 46. In the illustrated embodiment, operational amplifier 46 is a MOS input unity gain operational amplifier having low input offset voltage. Operational amplifier 46 has an inverting input connected to NODE 3 and a non-inverting input connected to NODE 4. An output of operational amplifier 46 is connected to NODE 3, as shown.

In operation, ESD network 36 protects the protected device against electro-static discharge to first pin 40. If a positive discharge occurs to first pin 40, NODE 4 experiences a rise in voltage level. This rise in voltage level forward biases the emitter-to-base junction of PNP transistor 44. NODE 3 then also experiences a rise in voltage level. This rise in voltage level of NODE 3 forward biases the base-to-collector junction of NPN transistor 38. Part of the current driven by the electro-static discharge to pin 40 is conducted through the emitter-to-base junction of PNP transistor 44, through the base-to-collector junction of NPN transistor 38 and into power supply $V_{cc}$. Thus, PNP transistor 44 is turned on. The rest of the current is conducted through the emitter-base-collector of PNP transistor 44 into ground.

On the other hand, if a negative discharge occurs to first pin 40, NODE 4 experiences a decrease in voltage level. This decrease in voltage level forward biases the base-to-emitter junction of NPN transistor 38. NODE 3 then experiences a decrease in voltage level. This decrease in voltage level forward biases the collector-to-base junction of PNP transistor 44. Part of the current driven by the electro-static discharge is conducted through the collector-to-base junction of PNP transistor 44 and through the base-to-emitter junction of NPN transistor 38. Thus, NPN transistor 38 is turned on. The rest of current is conducted from power supply $V_{cc}$ through the collector-base-emitter of NPN transistor 44 into first pin 40. In this manner, ESD circuit 32 protects the protected device against both positive and negative electro-static discharge to first pin 40.

Bias circuit 34 operates to actively bias ESD circuit 32 to ensure that voltage differences across each current leakage path in ESD circuit 32 are held substantially equal to zero volts during normal operation of the protected device. Operational amplifier 46 receives the voltage level of NODE 4 at the non-inverting input, as shown. Due to the operation of operational amplifier 46, NODE 3 is forced to a voltage level substantially equal to the voltage level of NODE 4. The only difference might be the input offset voltage of operational amplifier 46. For the illustrated embodiment, this input offset voltage is approximately one millivolt.

The voltage difference across the base-to-emitter junction in NPN transistor 38 is therefore held substantially equal to zero volts. Similarly, the emitter-to-base junction of PNP transistor 44 is held substantially equal to zero volts. Consequently, little or no leakage current can flow into or out of NODE 4 due to ESD network 36 during normal operation of the protected device. Thus, bias circuit 34 actively biases ESD circuit 32 such that any damage to the junctions that dissipate energy during electro-static discharge will not result in significant leakage current during normal operation of the protected device.

Bias circuit 34 also provides a guard ring bias voltage at NODE 3. This guard ring bias voltage is supplied to second pin 42. This bias voltage is available for use in protecting pin 40 by biasing a guard ring. First pin 40 can then be protected against surface leakage on a printed circuit board.

A low leakage ESD network for protecting a semiconductor device constructed according to the teachings of the present invention provides efficient and economical protection of a semiconductor device. The benefits of the present invention are particularly applicable to protecting an electrometer grade operational amplifier.

Typically, the inverting and non-inverting inputs of an electrometer grade operational amplifier are held at the same potential due to the operation of the operational amplifier. The only difference in voltage is a minimal input offset voltage. In order to protect the inputs of such an operational amplifier, one standard unity gain operational amplifier is needed to bias a standard ESD circuit. This unity gain operational amplifier can actively bias the ESD circuit and force substantially zero voltage across current leakage junctions in the ESD circuit. A low leakage ESD protection scheme is therefore provided.

Further, the bias voltage provided by the bias circuit can be connected to a spare pin of the integrated circuit package to provide a guard ring bias voltage output. This pin can then be used to drive a guard ring protecting input pins or other pins of the package. The guard ring may be constructed from copper or other metal or other suitable material. In this way, the guard ring is tied to a bias voltage that is substantially equal to the voltage level on the input or other pins. Thus, any surface leakage on the printed circuit board will terminate in the guard ring and will not travel into the input pins. The only voltage difference between the guard ring and the input pins might be the input offset voltage of the unity gain operational amplifier used in the bias circuit of this embodiment.

A technical advantage of the present invention therefore is the active biasing of an ESD circuit to hold voltage differences across each current leakage path in an ESD circuit substantially equal to zero volts. This active biasing ensures little or no leakage current during normal operation of the protected device. A further technical advantage of the present invention is the provision of a guard ring bias voltage for biasing a guard ring protecting inputs to the integrated circuit package against surface leakage on a printed circuit board.

Although the present invention has been described in detail, it should be understood that various changes, substitutions, and alterations can be made thereto without departing from the spirit and scope of the invention as defined by the appended claims.

What is claimed is:

1. A low leakage ESD network for protecting a semiconductor device, comprising:
    an ESD circuit coupled to an input of a semiconductor device, the ESD circuit operable to protect the input of the semiconductor device against electro-static discharge, the ESD circuit comprises: an NPN transistor having a collector, a base and an emitter, the collector coupled to a positive power supply, and the emitter coupled to the input of the semiconductor device: a PNP transistor having an emitter, a base and a collector, the emitter coupled to the input of the semiconductor device, the base coupled to the base of the NPN transistor, and the collector coupled to ground potential; and
    a bias circuit coupled to the input of the semiconductor device and to the ESD circuit, the bias circuit operable to actively bias the base of the NPN transistor and the base of the PNP transistor such that voltage differences between the input of the semiconductor device and the base of the NPN transistor and between the semiconductor device and the base of the PNP transistor are held substantially equal to zero volts during normal operation of the semiconductor device.

2. The ESD network of claim 1, wherein the bias circuit is further operable to provide a guard ring bias voltage such that a voltage difference between the guard ring bias voltage and the input of the semiconductor device is held substantially equal to zero volts during normal operation of the operational amplifier.

3. The ESD network of claim 1, wherein the bias circuit comprises a MOS input operational amplifier having a non-inverting input, an inverting input and an output, the non-inverting input coupled to the input of the semiconductor device, the inverting input coupled to the output, and the output coupled to the ESD circuit.

4. The ESD network of claim 1, wherein the semiconductor device comprises a MOS semiconductor device.

5. The ESD network of claim 1, wherein the semiconductor device comprises a MOS input operational amplifier.

6. The ESD network of claim 1, wherein
    the bias circuit comprises a unity gain MOS input operational amplifier having a non-inverting input coupled to the input of the semiconductor device, having an inverting input coupled to an output of the operational amplifier, and having the output coupled to the base of the NPN transistor.

7. The ESD network of claim 1, wherein the ESD network comprises an integrated circuit formed on a semiconductor chip and mounted in an integrated circuit package.

8. A method of constructing a low leakage ESD network for protecting a semiconductor device, comprising the steps of:
    forming an ESD circuit such that the ESD circuit is coupled to and protects an input of a semiconductor device against electro-static discharge, the step of forming an ESD circuit comprises: forming an NPN transistor having a collector, a base and an emitter, the collector coupled to a positive power supply, and the emitter coupled to the input of the semiconductor device; and forming a PNP transistor having an emitter, a base and a collector, the emitter coupled to the input of the semiconductor device, the base coupled to the base of the NPN transistor, and the collector coupled to ground potential;
    forming a bias circuit coupled to the input of the semiconductor device such that the bias circuit provides a bias voltage output responsive to a voltage level of the input of the semiconductor device; and
    connecting the bias voltage output of the bias circuit to the ESD circuit such that the bias circuit is operable to actively bias the ESD circuit to hold voltage differences between the input of the semiconductor device and the base of the PNP transistor and between the input of the semiconductor device and the base of the NPN transistor substantially equal to zero volts during normal operation of the semiconductor device.

9. The method of claim 8, wherein the step of forming a bias circuit comprises forming a bias circuit further operable to provide a guard ring bias voltage such that a voltage difference between the guard ring bias voltage and the input of the semiconductor device is held substantially equal to zero volts during normal operation of the operational amplifier.

10. The method of claim 8, wherein the step of forming a bias circuit comprises forming a bias circuit that comprises a MOS input operational amplifier having a non-inverting input, an inverting input and an output, the non-inverting input coupled to the input of the semiconductor device, the inverting input coupled to the output, and the output coupled to the ESD circuit.

11. The method of claim 8, wherein the step of forming an ESD circuit comprises forming an ESD circuit that is coupled to and protects the input of a MOS semiconductor device.

12. The method of claim 8, wherein the step of forming an ESD circuit comprises forming an ESD circuit that is coupled to and protects the input of a MOS input operational amplifier.

13. The method of claim 8, wherein
    the step of forming a bias circuit comprises forming a unity gain MOS input operational amplifier having a non-inverting input coupled to the input of the semiconductor device, having an inverting input coupled to an output of the operational amplifier, and having the output coupled to the base of the NPN transistor.

14. The method of claim 8, wherein the steps of forming an ESD circuit, forming a bias circuit, and connecting comprise forming the ESD circuit, forming the bias circuit and connecting in an integrated circuit on a semiconductor chip operable to be mounted in an integrated circuit package.

* * * * *